United States Patent [19]

Hershel et al.

[11] 4,425,037

[45] Jan. 10, 1984

[54] APPARATUS FOR PROJECTING A SERIES OF IMAGES ONTO DIES OF A SEMICONDUCTOR WAFER

[75] Inventors: Ronald S. Hershel, Albany, Oreg.; Martin E. Lee, Saratoga, Calif.

[73] Assignee: General Signal Corporation, Stamford, Conn.

[21] Appl. No.: 378,370

[22] Filed: May 14, 1982

Related U.S. Application Data

[60] Division of Ser. No. 264,171, May 15, 1981, abandoned, and a continuation-in-part of Ser. No. 264,249, May 15, 1981, abandoned.

[51] Int. Cl.³ .................. G03B 27/52; G03B 27/70
[52] U.S. Cl. ........................... 355/43; 350/173; 350/442; 355/53; 355/55; 355/61; 356/152; 356/401
[58] Field of Search ............ 355/53, 54, 55, 49, 355/40, 43, 51, 61; 352/108; 350/173, 442; 340/146, 3 H; 269/21; 235/151.11; 356/152, 401

[56] References Cited

U.S. PATENT DOCUMENTS

| | | | |
|---|---|---|---|
| 1,401,345 | 12/1927 | Mechau | 352/108 |
| 2,234,717 | 3/1941 | Altman et al. | 355/49 |
| 2,742,817 | 4/1956 | Altman | 350/442 |
| 3,536,380 | 10/1970 | Ferguson | 350/199 |
| 3,693,154 | 9/1972 | Kubo et al. | 340/146.3 H |
| 3,748,015 | 7/1973 | Offner | 350/55 |
| 3,796,497 | 3/1974 | Mathisen et al. | 356/152 |
| 3,809,050 | 5/1974 | Chough et al. | 125/35 |
| 3,818,327 | 6/1974 | Alexander | 324/34 TK |
| 3,898,617 | 8/1975 | Kashioka et al. | 340/146.3 H |
| 3,917,399 | 11/1975 | Buzawa et al. | 355/43 |
| 3,951,546 | 4/1976 | Markle | 355/51 |
| 3,955,072 | 5/1976 | Johannsmeier et al. | 235/151.11 |
| 3,989,385 | 11/1976 | Dill et al. | 356/152 |
| 4,084,903 | 4/1978 | Pircher | 355/53 |
| 4,091,394 | 4/1978 | Kashioka et al. | 340/146.3 H |
| 4,103,989 | 8/1978 | Rosin | 350/199 |
| 4,115,762 | 9/1978 | Akiyama et al. | 340/146.3 H |
| 4,131,267 | 12/1978 | Ono et al. | 269/21 |
| 4,171,870 | 10/1979 | Bruning et al. | 350/173 |
| 4,171,871 | 10/1979 | Dill et al. | 350/199 |
| 4,198,159 | 4/1980 | Cachon | 355/55 |
| 4,213,117 | 7/1980 | Kembo et al. | 340/146.3 H |
| 4,232,969 | 11/1980 | Wilczynski | 356/401 |
| 4,295,735 | 10/1981 | Lacombat et al. | 355/43 |
| 4,298,273 | 11/1981 | Nishizuka et al. | 355/61 |

OTHER PUBLICATIONS

"Autoalignment in Step-And-Repeat Wafer Printing", Ronald S. Hershel, Optical Sciences Center, University of Arizona, Prepared for SPIE Conference, Semiconductor Microlithography IV, in San Jose, Apr. 1979.

"The Optics in the Model 900 Projection Stepper", Ron Hershel, Department of Electrical Engineering and Computer Science, Oregon State University, Prepared for the Proceedings of the SPIE Conference on Developments in Microlithography V, held Mar. 17-18, 1980 at San Jose, California.

Journal of the Optical Society of America, "Unit Magnification Optical System without Seidel Aberrations", J. Dyson, vol. 49, No. 7, 7/59, pp. 713-716.

Optical Instruments and Technique, "A Unit-Power Telescope for Projection Copying", C. G. Wynne, Oriel Press 1979, pp. 429-434.

IBM Technical Disclosure Bulletin, "Electro-Optical Alignment of Substrates", W. Bojman, vol. 13, No. 9, 2/71, pp. 2687-2688.

*Primary Examiner*—Richard A. Wintercorn
*Attorney, Agent, or Firm*—Thomas R. FitzGerald; Charles E. Snee, III; George Vande Sande

[57] ABSTRACT

The apparatus forms one-to-one reticle images on a wafer. The apparatus includes means for holding a reticle containing an image pattern corresponding to the size of the desired wafer pattern. An illumination system substantially uniformly illuminates the reticle pattern. A one-to-one stationary projection optical system projects an image of the reticle pattern onto a predetermined focal plane. Suitable means such as a vacuum chuck holds the wafer. An alignment system steps and orients a wafer chuck to register markings on the individual dies of the wafer with the projected image of corresponding markings on the reticle. A fluid servo system acts on the chuck to hold at least a portion of the wafer in the predetermined focal plane of the projection optical system.

15 Claims, 19 Drawing Figures

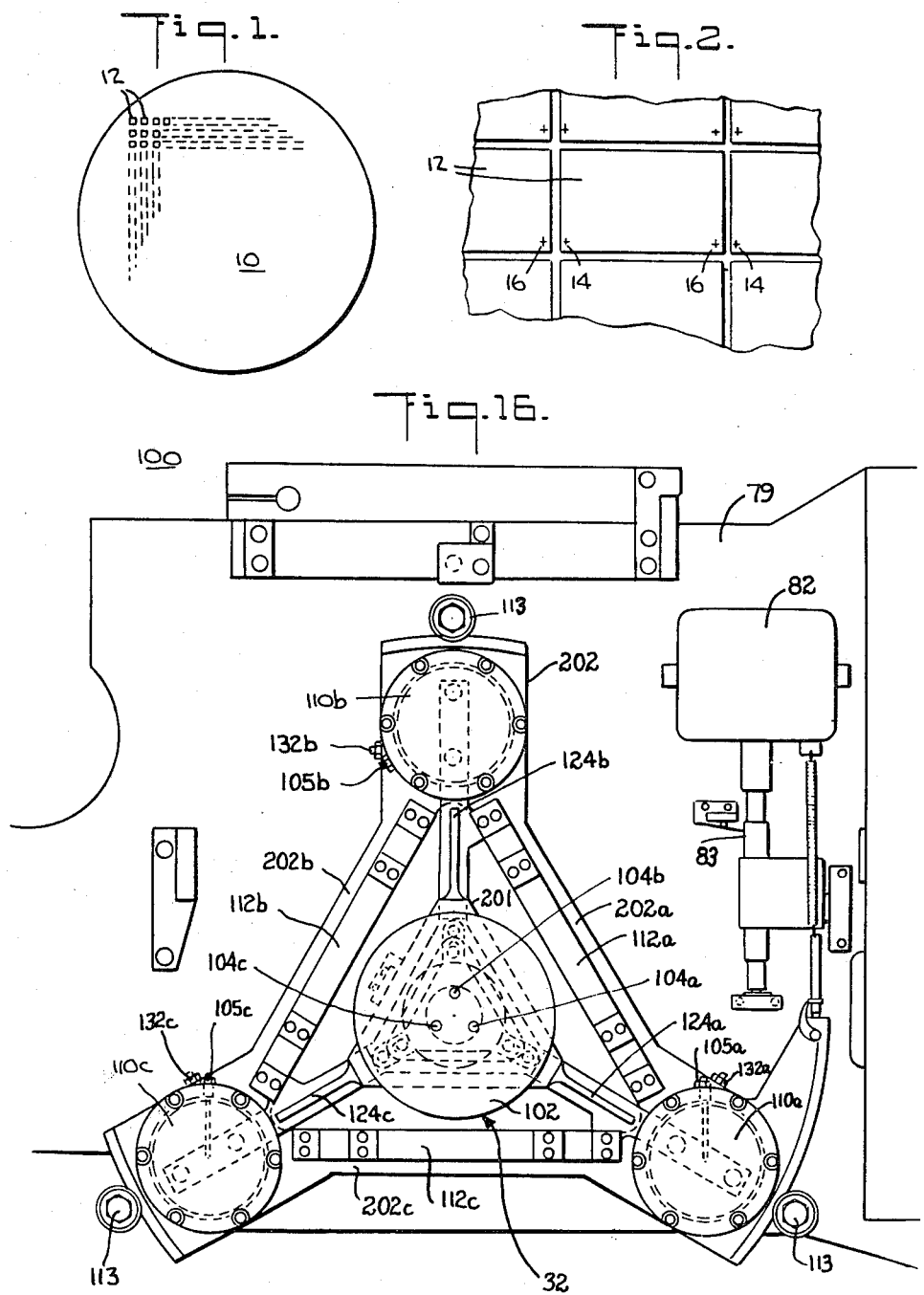

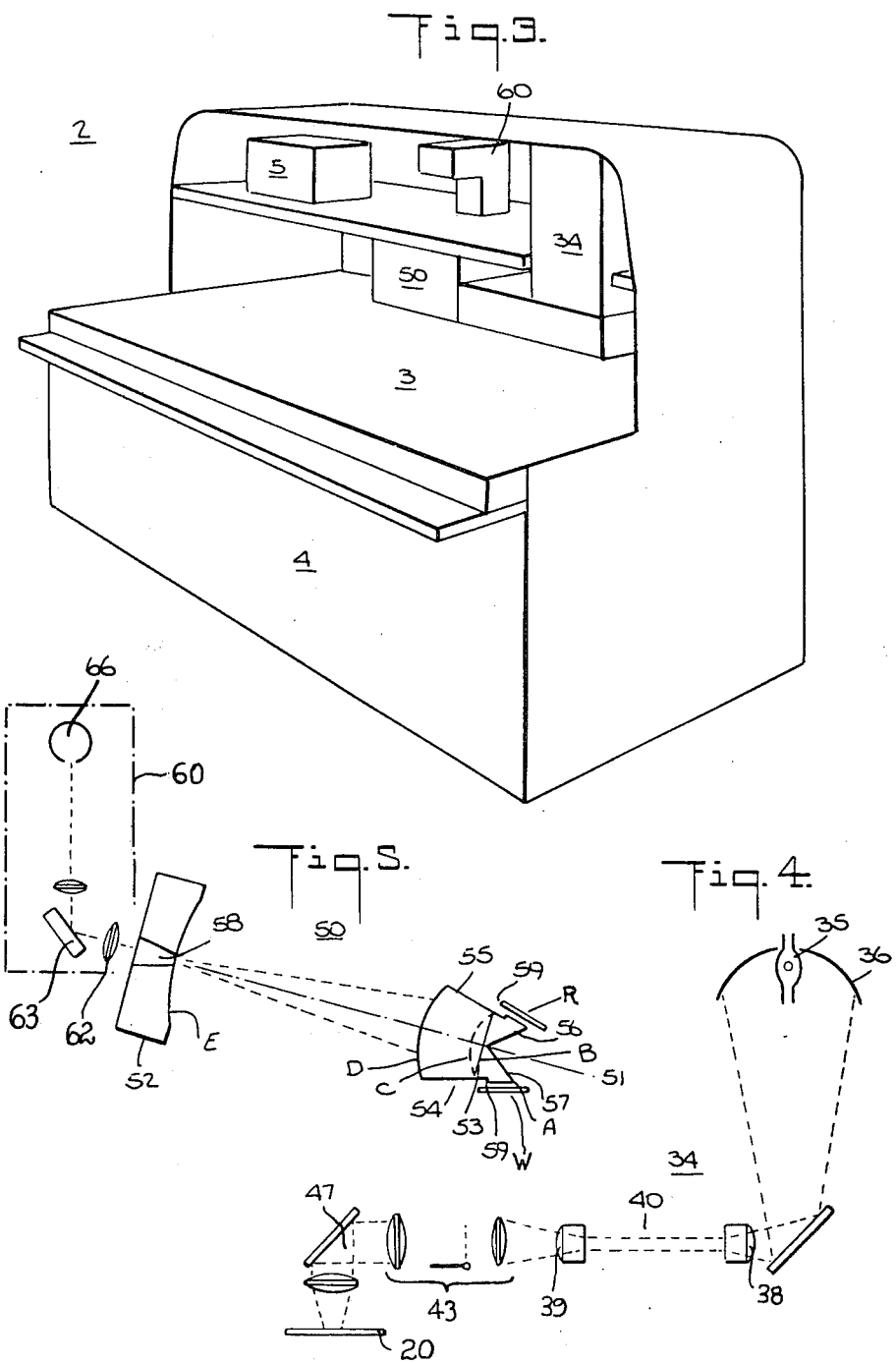

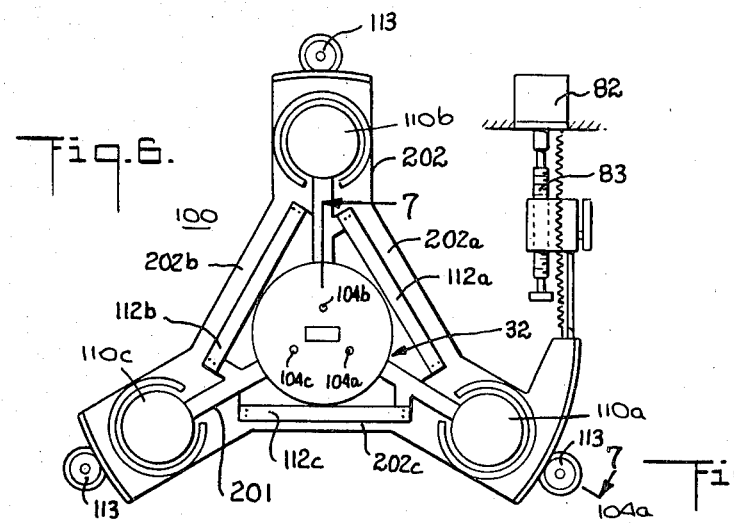
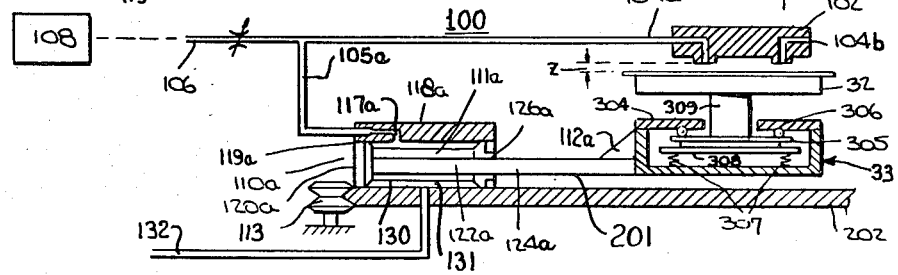
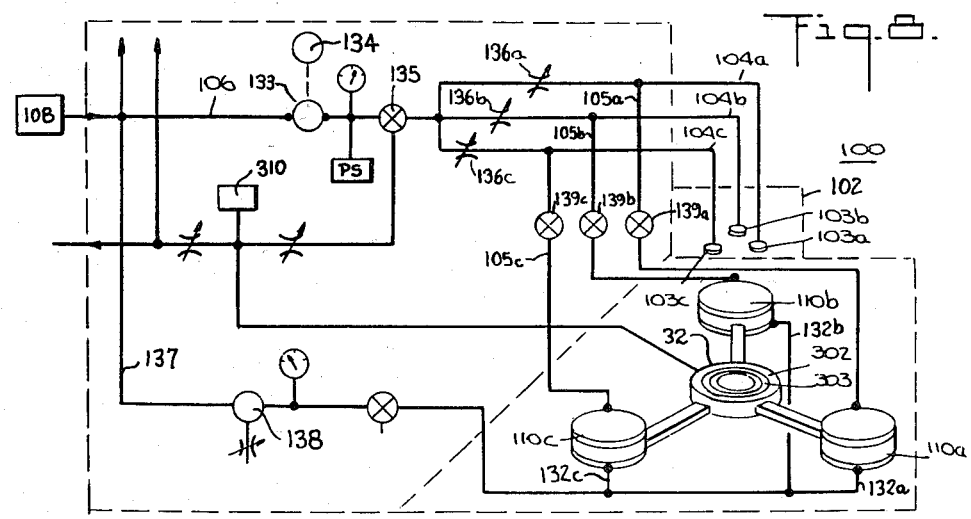

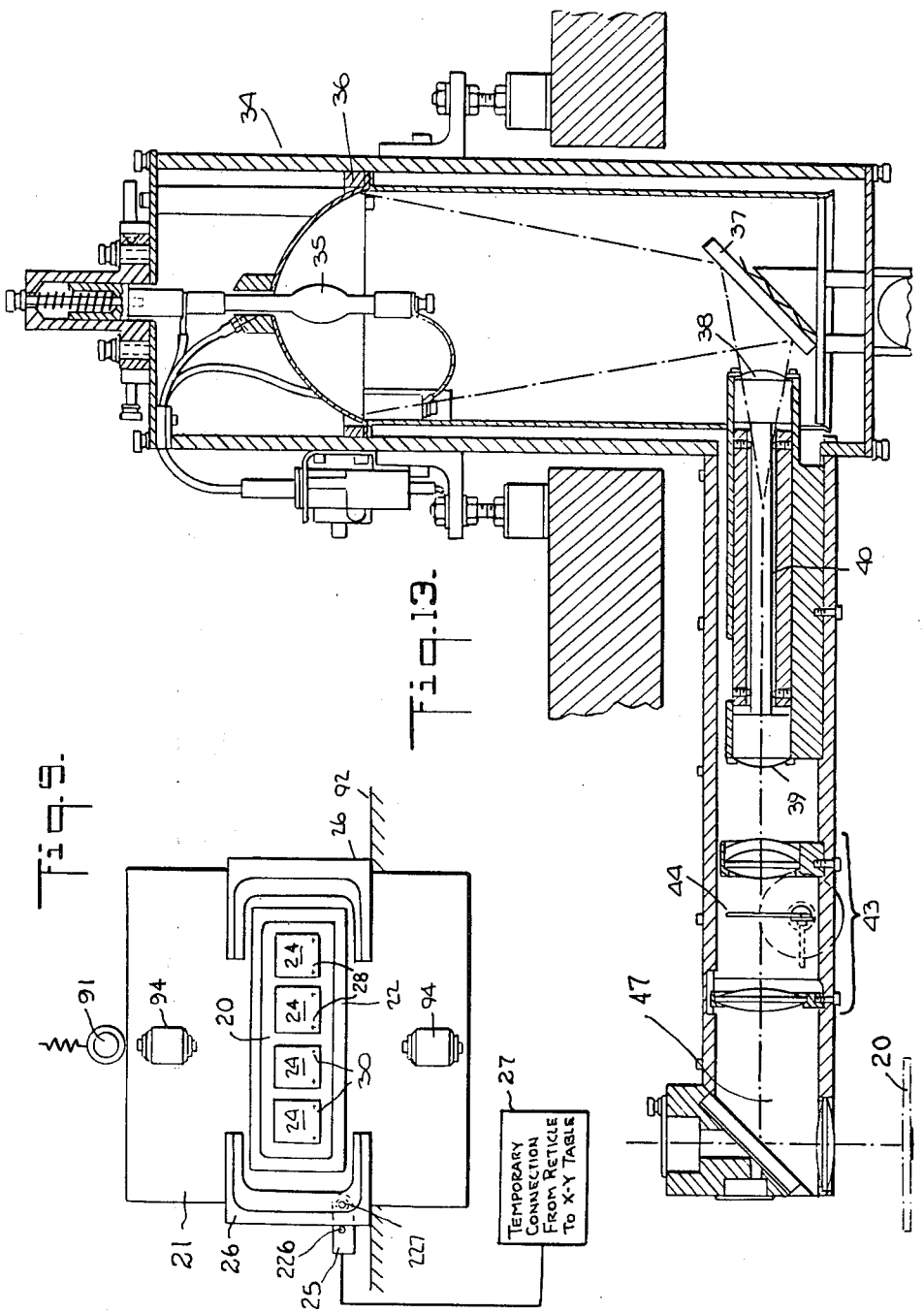

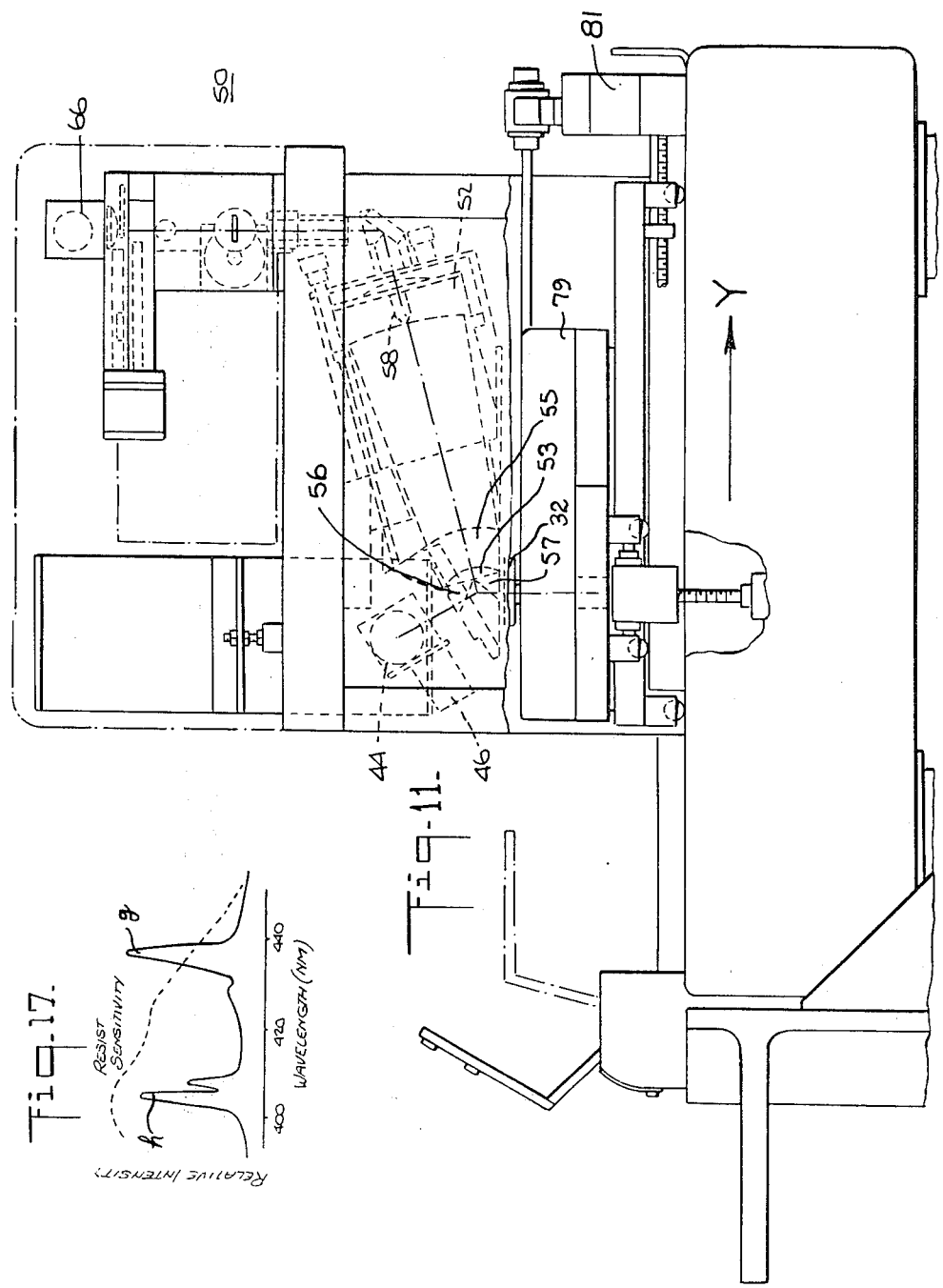

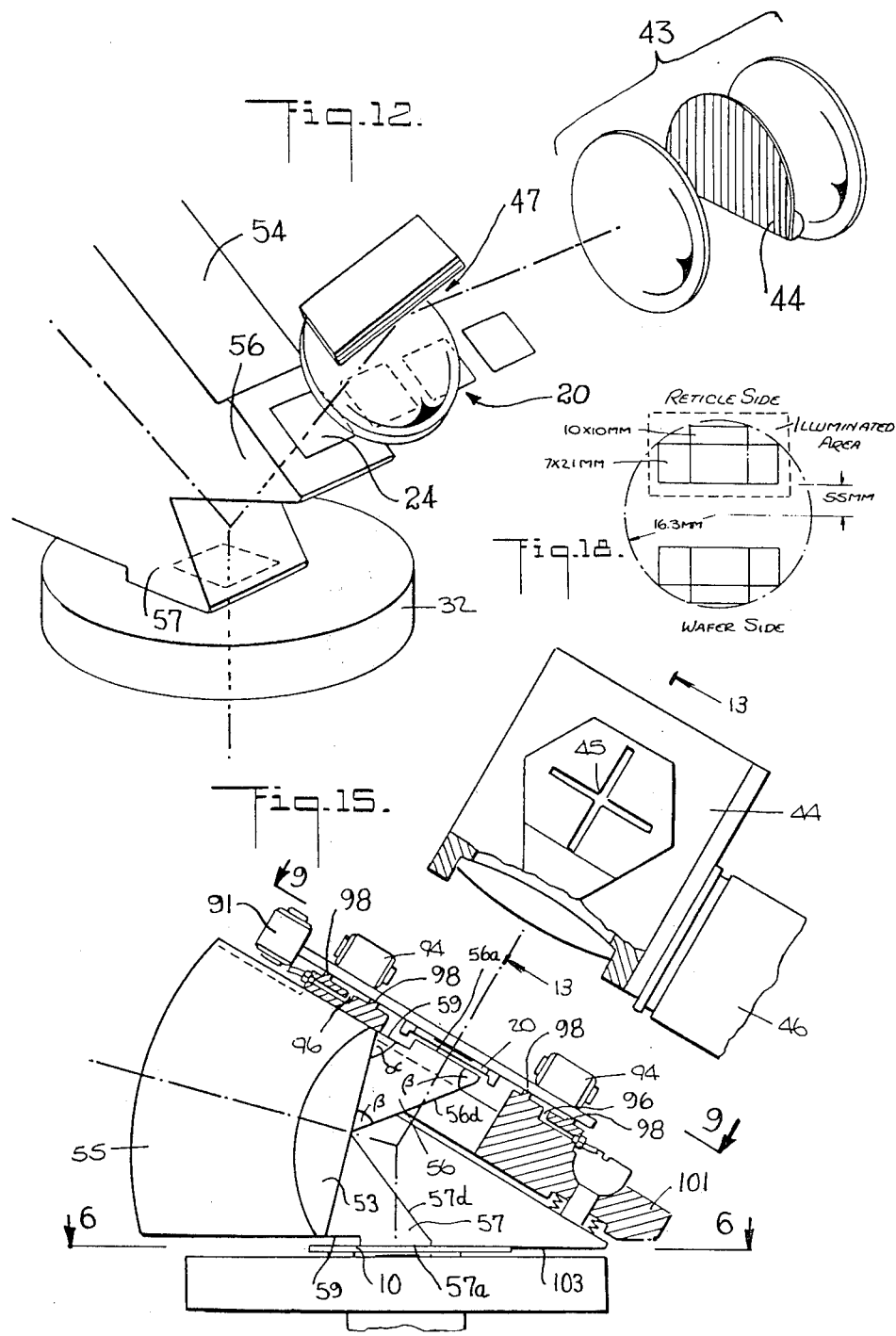

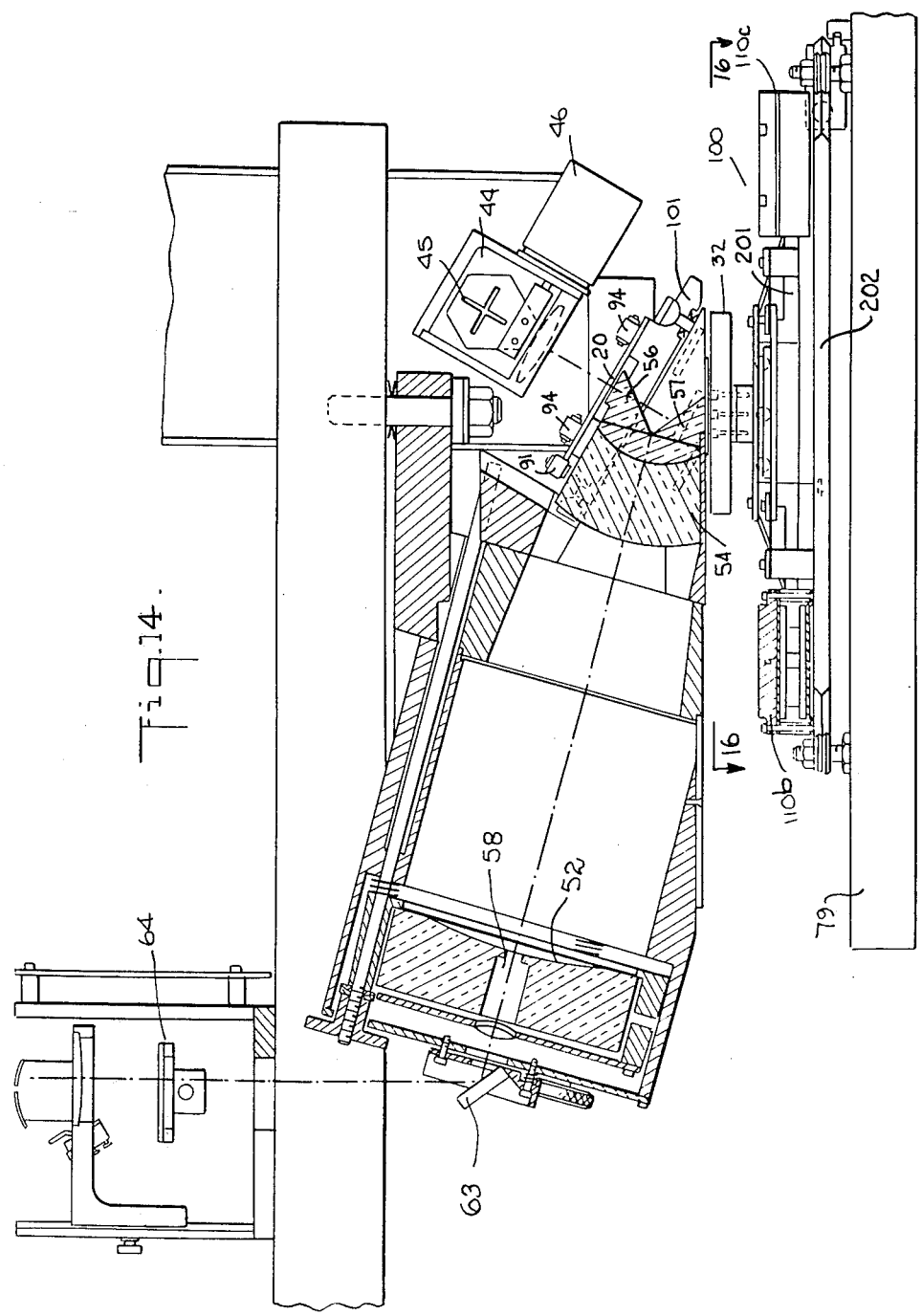

APPARATUS FOR PROJECTING A SERIES OF IMAGES ONTO DIES OF A SEMICONDUCTOR WAFER

DESCRIPTION

CROSS-REFERENCE TO RELATED APPLICATIONS

This application is a divisional of copending application Ser. No. 264,171 and a c-i-p of Ser. No. 264,249 filed May 15, 1981, and now abandoned. This application claims joint inventions of the individual applicants of these copending applications.

TECHNICAL FIELD

The invention concerns apparatuses for microlithographically forming patterns on semiconductor wafers. More particularly, the invention concerns an improved system for one-to-one projection of pattern images onto a predetermined focal plane.

BACKGROUND ART

The fabrication of integrated circuits requires a method for accurately forming patterns on a semiconductor wafer. A photoengraving process known as photolithography, or simply masking, is widely employed for this purpose. The microelectronic circuit is built up layer by layer, each layer being based on a pattern received from a photolithographic mask. Such masks typically comprise a glass plate approximately the size of a wafer, the plate having a single pattern repeated many times over its surface. Each repeated pattern corresponds to a pattern to be imposed upon a layer of a wafer.

The mask patterns are derived from an optical reticle having a primary pattern which may be generated by a computer controlled light spot or electron beam which is scanned across a photosensitive plate. The reticle pattern is typically ten times the final size of the pattern to be imposed on the wafer. An image one-tenth the size of the reticle pattern is projected optically on the final mask. The reticle pattern is reproduced side by side many times on the mask, in a step-and-repeat process. Recent advances in reticle production have made it possible to produce reticles having patterns the same size as the final pattern. If such a reticle pattern could be aligned and focused onto a wafer, the mask fabrication could be substantially simplified or entirely eliminated thereby achieving a substantial savings.

The photolithographic process requires that each pattern on the mask be positioned accurately with respect to the layers already formed on the surface of the wafer. One technique is to hold the mask just off the surface of the wafer and to visually align the mask with the patterns in the wafer. After alignment is achieved, the mask is pressed into contact with the wafer. The mask is then flooded with ultraviolet radiation to expose photoresist on the surface of the wafer. The space between the wafer and the mask is often evacuated to achieve intimate contact; atmospheric pressure squeezes the wafer and the mask together. The latter apparatus is typically known as a contact printer. One defect of contact printers is that the masks quickly become abraded and useless. Since mask fabrication is expensive, it would be desirable to have another method that did not wear out the mask.

In view of the foregoing, a recent trend has been toward a technique known as projection alignment, in which an image of the mask pattern is projected onto the wafer through an optical system. In this case, mask life is virtually unlimited. However, one drawback has been that wafer sizes have been increasing, and the task of designing optics capable of projecting an accurate image over the larger area is becoming more difficult. Another drawback is the moveable projection optical system used in some machines for focusing a projected image onto a wafer. It is often difficult to focus such moveable optical systems and to hold the system in focus.

Recent projection aligners have attempted to circumvent the extreme difficulty of constructing a lens capable of resolving a micrometer-sized features over an area of many square inches. A much smaller area, on the order of one square centimeter, is exposed, and the exposure is repeated by stepping or scanning the projected image of the mask pattern over the wafer. Such machines are known as projection steppers. So far, all of the efforts to provide commercially acceptable projection steppers have been less than satisfactory. The use of one-to-one, or unit magnification, projection optics has become more frequent in such systems; however, achieving an adequately corrected, suitably large field in such systems has continued to present problems to those working in the art. As a result, a need has continued to exist for a projection stepping machine capable of using the now available, smaller reticles for directly forming patterns on wafers, thereby eliminating the need for a large, multiple pattern mask.

Unit magnification catadioptric lens system have been used in a variety of applications. U.S. Pat. No. 2,742,817 disclosed different types of unit magnification lenses, including one in which a concave spherical mirror was combined with a plano-convex lens, the lens being positioned between the mirror and the center of curvature of the mirror. The radius of curvature of the plano-convex lens was chosen so that it did not coincide with the center of curvature of the mirror, and the index of refraction and dispersion power of the lens were chosen so that the Petzval sum of the lens was numerically equal to the curvature of the mirror. The patent indicates that the single plano-convex lens can be replaced by a cemented doublet in order to achieve color correction but that in such a simple system, considerable difficulty is encountered in correcting various aberrations. The use of an achromatic doublet was said to permit the lens to be placed closer to the focal plane than would use of a single plano-convex lens.

An article entitled "Unit Magnification Optical System Without Seidel Aberrations" was published in July, 1959 in Volume 49, No. 7 of the *Journal of the Optical Society of America* at pages 713–716. The author, J. Dyson, disclosed that when the radius of a concave mirror and a plano-convex lens are chosen so that the upper principle focus of the lens lies on the surface of the mirror and so that the centers of curvature of the spherical surfaces coincide, then the flat face of the plano-convex lens will be a common object/image plane for the system. The sagittal image plane is flat; whereas, the tangential surface is a fourth order curve. The use of prisms to couple light into and out of the lens was disclosed, as was the use of a small air gap between the prism face and image/object surface. Such an air gap was said to introduce spherical and chromatic aberrations of a sense opposite to those provided by the lens so that by proper choice of the gap thickness and glass type, the author asserted, it would be possible to correct both types of aberrations simultaneously.

An article entitled "A Unit Power Telescope for Projection Copying" by C. G. Wynne appeared in 1969 in a book entitled *Optical Instruments and Techniques* at pages 429–434. A projection system was disclosed for use in making microcircuits by projection lithography. A concave spherical mirror, a meniscus lens, a planoconvex lens and a beam splitter were used. To correct the lens for both projection and alignment wavelengths, all spherical surfaces were required to be concentric; the material of the meniscus lens had to have a higher dispersion than that of the plano-convex lens; and to achieve chromatic correction of the Petzval curvature, the lenses had to have the same mean refractive index but different dispersions. The use of an air gap between the object/image planes and the surfaces of the beam splitter was disclosed. The author noted that "the spherical aberration caused by introducing a plane parallel air space is of opposite sign to that caused by introducing a plane parallel plate of higher refractive index. The Seidel spherical aberration of the plane parallel air space . . . can therefore be corrected by making the beam splitter cube of slightly higher refractive index than that of the plano-convex lens to which it is cemented; and by an appropriate choice of glass dispersion, chromatic aberration can be corrected at the same time. The higher orders of spherical aberration cannot be corrected, but for small air spaces, the uncorrected residuals are very small." The Wynne lens provided improved correction over a larger field; however, the lens was quite bulky, the air gap at the image and object planes was rather small and the orientation of the image and object planes made use of the lens rather impractical in a projection stepping system. A variation of the Wynne system is shown in U.S. Pat. No. 3,536,380 which disclosed a unit magnification lens in which the spherical surfaces are all concentric.

U.S. Pat. No. 4,103,989 disclosed a number of unit power concentric optical systems. The patentee departed from the formula suggested by Dyson for eliminating Seidel aberrations by changing the radius of the lens relative to the mirror; however, concentricity of the spherical surfaces was maintained. The use of prisms to separate the image and object planes is taught and such an arrangement is said to be superior to the beam splitter disclosed by Dyson.

U.S. Pat. No. 4,171,871 disclosed still another type of achromatic unit magnification optical system. In an effort to correct the lens over a very wide spectral range, the patentees permitted the spherical surfaces to be non-concentric and used as many as eight optical surfaces and six types of glass in an effort to correct the lens at all wave lengths within the range. A total thickness of glass of approximately 110 millimeters is used to achieve a rather small corrected field approximately 5 millimeters in height and an air gap of only 0.39 millimeters.

DISCLOSURE OF THE INVENTION

The invention provides an apparatus for projecting an image of a reticle pattern onto a wafer, with one-to-one magnification. The apparatus includes means for holding a reticle containing a pattern corresponding to the size of the desired wafer pattern. An illumination system substantially uniformly illuminates the reticle pattern. A stationary one-to-one projection optical system projects an image of the reticle pattern onto a predetermined focal plane. Suitable means such as a vacuum chuck holds the wafer. An alignment system steps and orients the wafer chuck to register markings on the individual dies of the wafer with corresponding markings on the projected image of the reticle pattern. A fluid servo system acts on the chuck to hold at least a portion of the wafer in the predetermined focal plane of the projection optical system.

The unit magnification optical projection system of the invention comprises a concave spherical reflecting surface, an achromatic lens made from a cemented meniscus lens and a plano-convex lens, and a pair of prisms which divide the field of the plano-convex lens to produce separated object and image planes, one at the semiconductor wafer and one at the reticle. The combination of mirror, lenses and prisms is corrected at two spectral lines of a mercury lamp. The lamp is operated at higher than normal power to produce a high spectral continuum between these two lines and other parts of the spectrum are blocked by suitable filters. The high continuum ensures that exposure times will be short enough even though exposure is made over only a portion of the lamp's spectrum. To provide optimum correction, the centers of curvature of the various spherical surfaces are noncoincident. Proper selection of lens geometry and materials ensures both a large corrected field and an adequate air gap adjacent the image and object planes to facilitate movement of the reticle and wafer.

The reticle is prepositioned relative to the alignment system so that when a wafer is to be exposed to the projected image of a reticle pattern, the system will already know the position of fiducial marks on the reticle and will be able to align them with corresponding fiducial marks on the wafer. The projected image of fiducial marks on the reticle is scattered from a specially prepared wafer through a dark field alignment aperture provided in the spherical mirror of the optical projection system. A system of lenses and adjustable masks directs this scattered light to a photomultiplier detector whose output indicates when the reticle is properly positioned. Then when a conventional wafer is to be aligned, the projected image of the fiducial mark on the reticle is scattered by the fiducial marks on the wafer and the output of the detector indicates when the two are properly aligned for exposure.

As part of the focusing system, the vacuum chuck platform has three arms extending radially outwardly from the chuck. Attached to each arm is a piston that can be moved up or down in a cylinder by a pair of oppositely active diaphragms. The diaphragms and the upper and lower end walls of the cylinder define upper and lower fluid chambers. The lower chamber of each cylinder is supplied with fluid at a predetermined fixed pressure. Three fluid probes, each comprising an orifice disposed adjacent to the wafer, are connected to a source of fluid pressure. Each probe also is connected by a fluid signal line to a corresponding upper chamber of an associated cylinder. Thus, the fluid pressure in the air gap between each probe and the wafer is the same as that acting on the corresponding upper diaphragm. That upper diaphragm pressure is balanced by the fixed lower diaphragm pressure.

The system operates to maintain the wafer at a predetermined distance from the orifices so that the surface of the wafer remains at the focal plane of the projection system. If the air gap between the wafer and an individual probe changes due to irregularities in the surface of the wafer or other reasons, then the pressure acting on the upper diaphragm will also change. If the wafer moves below the focal plane, the air gap pressure drops and the pressure in the upper chamber is reduced. As a result, the pressure on the lower diaphragm acts upon the piston and the connected support arm to raise the chuck and return the wafer to its desired position at the focal plane. Likewise, if the wafer rises above the focal plane, thereby reducing the air gap, then the pressure acting on the upper diaphragm increases, thus forcing the piston and support arm in the opposite direction to increase the air gap until the wafer is returned to its desired position at the focal plane. In the preferred embodiment, three sets of pistons and probes are used to defne planar surfaces which can be positioned accurately relative to the focal plane of the projection system.

BRIEF DESCRIPTION OF THE DRAWINGS

FIG. 1 is a plan view of a typical wafer having a plurality of dies formed thereon.

FIG. 2 is an enlarged fragmentary view of the wafer of FIG. 1, showing the dies on the wafer and the fiducial markers on the dies.

FIG. 3 is a perspective, schematic view of a projection stepper.

FIG. 4 is an optical schematic view of the illumination system of the projection stepper.

FIG. 5 is an optical schematic view of the projection system and fiducial marker detection system of the projection stepper.

FIG. 6 is a simplified plan view of the wafer platform of the projection stepper, taken on line 6—6 of FIG. 15.

FIG. 7 is a fragmentary sectional and partly schematic view of a portion of the wafer platform and focusing system, taken on line 7—7 of FIG. 6.

FIG. 8 is a fluid schematic of the focusing system.

FIG. 9 is a front elevational view of the reticle and apparatus for holding and advancing the reticle, taken on line 9—9 of FIG. 15.

FIG. 11 is a partial sectional view taken along the line 11—11 of FIG. 10 showing the optical projection and alignment systems in phantom lines.

FIG. 12 is a simplified, enlarged, partial perspective view of the illumination and projection optical system.

FIG. 13 is an elevation sectional view of the optical illumination system, taken on line 13—13 of FIG. 15.

FIG. 14 is an elevation, partially sectional view taken on line 14—14 of FIG. 10 of the optical projection system and portions of the wafer platform, the photomultiplier assembly, and the illumination system.

FIG. 15 is a partial sectional view of the illumination and projection optical systems.

FIG. 16 is a detailed plan view of the wafer platform with portions of the focusing system shown in phantom, taken on line 16—16 of FIG. 14.

FIG. 17 is a dual plot showing the relative intensity of illuminator output and the sensivity of a positive resist as a function of wavelength between 400–450 mm.

FIG. 18 is a planar view of the exposure area of the projection optical system.

BEST MODE FOR CARRYING OUT THE INVENTION

General

Figure 10:
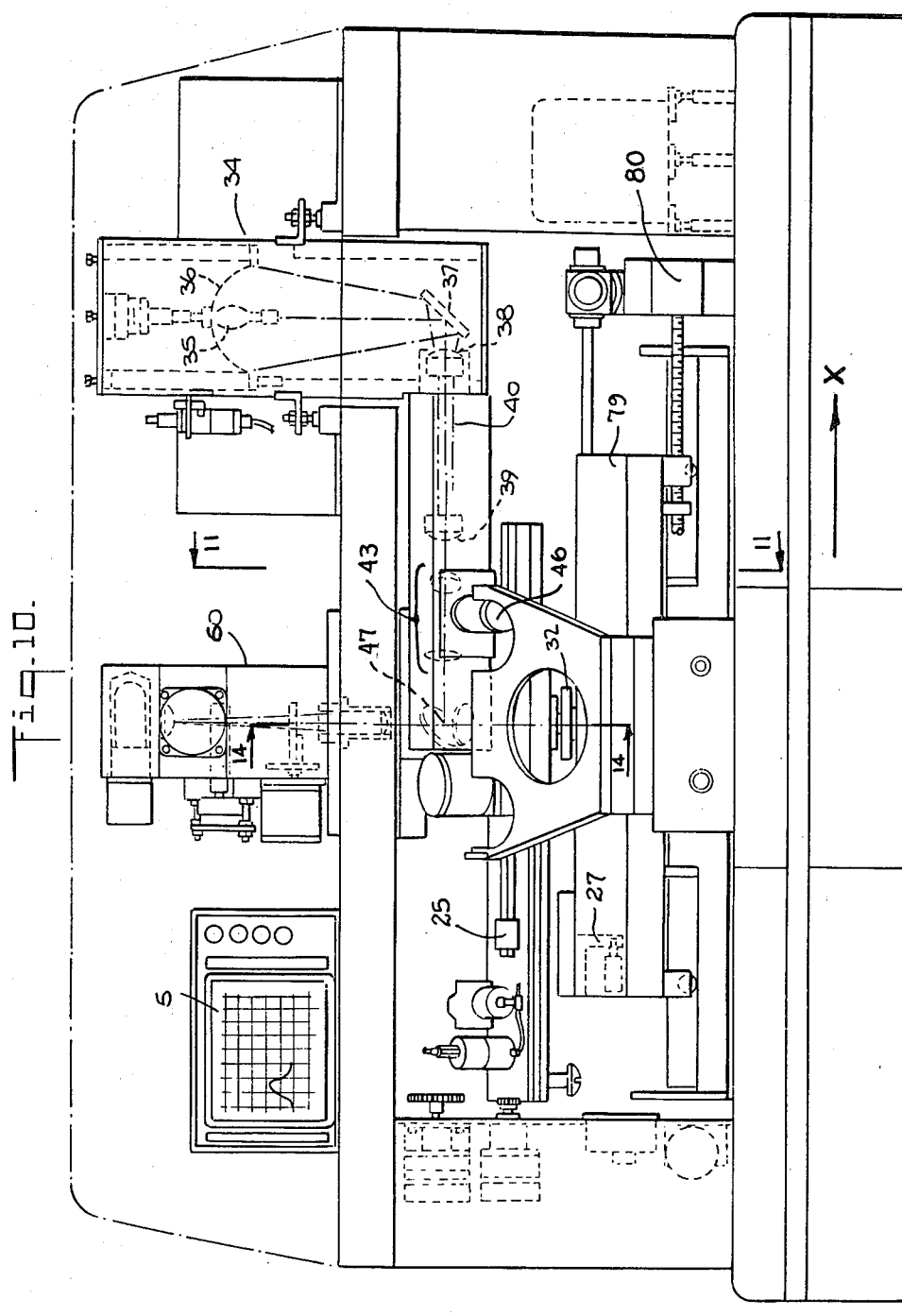
FIG. 10 is a partial front elevational view of the projection stepper showing the illumination system and portions of the projection system in phantom lines.
Figure 19:
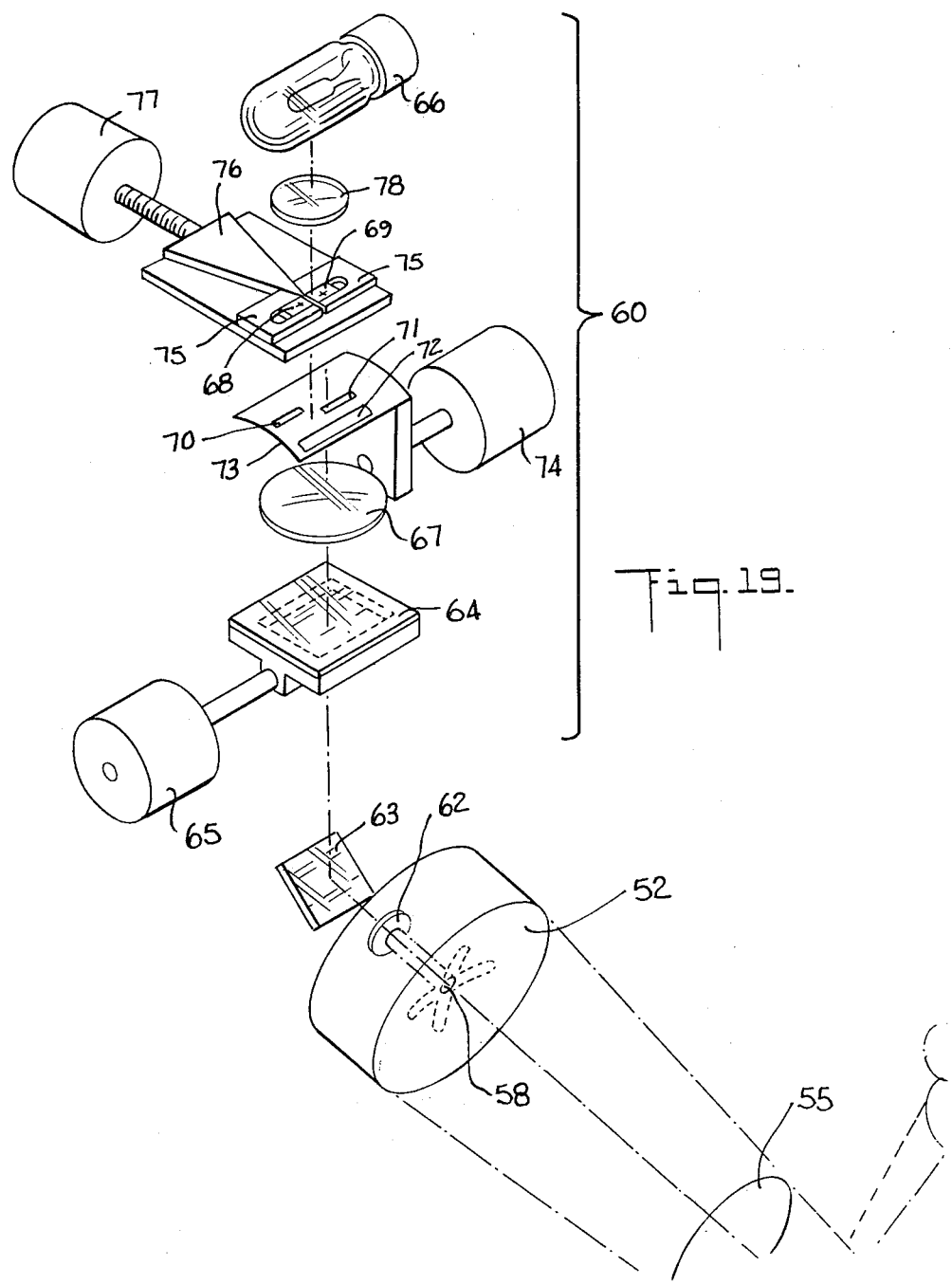
FIG. 19 is an exploded view of the photomultiplier stage.

FIGS. 3 and 10 show perspective and front elevation views of a projection stepping machine according to the invention. A shelf 3 supports a wafer positioning system 79 including a chuck 32 shown in FIGS. 6–8, 10, 12, 14 and 16. Underneath the shelf 3 is space 4 to hold power supplies and a computer (not shown). Above the shelf 3 are the illumination system 34, projection system 50, a dark field automatc alignment system 60, and a cathode ray tube display 5 for monitoring the alignment system 60.

In operation a reticle 20 shown in FIGS. 9 and 12–15 is disposed between illumination system 34 and projection system 50. Alignment system 60 controls the movement of the wafer positioning system 79 to align the dies 12 of a wafer 10 shown in FIGS. 1 and 2 with the projected image of the pattern on reticle 20. A focusing system 100 shown in FIGS. 6–8, 10, 11, 14 and 16 maintains the projected image of the reticle pattern in optimal focus on the wafer. The power output of illumination system 34 is increased to develop the exposed (non-imaged) areas of the dies 12. After exposure, the wafer positioning system is moved or stepped to bring another portion of the wafer 10 into alignment and focus with the projected reticle image.

Wafer

FIGS. 1 and 2 show a wafer 10 provided with a plurality of dies 12 arranged in rows and columns. Each die 12 has a pair of fiducial markers 14 and 16 at adjacent or opposite corners of the die. The markers 14 and 16 may be in the form of small "+" signs. As will be described in detail hereinafter, the markers 14 and 16 are used to align the dies with the projected image of the reticle pattern.

Reticle

Stepping machine 2 also includes a reticle 20 shown in FIGS. 9 and 12–15. Reticle 20 is mounted in a frame 22 and has a plurality of patterns 24 arranged in a row within the frame. Frame 22 in turn is disposed between a pair of oppositely opening reticle guides 26. A pellicle (not shown) covers the reticle 20. A pellicle is a thin, transparent membrane which seals off the reticle surface from dust and other contaminants. The pellicle is held in frame 22 a predetermined distance from the surface of patterns 24 so that the projected reticle image is practically unaffected by contaminants adhering to the pellicle.

Each pattern 24 has a pair of fiducial markers 28 and 30 at adjacent or opposite corners of the pattern in a manner similar to the markers 14 and 16 on dies 12. The markers 14 and 16 on each individual die are respectively aligned with the markers 28 and 30 of the projected images of reticle 20 before the image of that reticle is printed on each individual die.

Wafer Positioning System

Holding means, such as a vacuum chuck 32 shown in FIGS. 6–8, 10–12, 14, 15 and 16, is disposed below projection system 50. Chuck 32 is moveable rectilinearly in two coordinate directions, such as X and Y directions, to align one of markers 14, 16 on the dies 12 with one markers 28, 30 on the projected images of reticle 20. The chuck is also rotatable in the same plane as that defined by the X and Y directions, to align the other of markers 14, 16 on the dies 12 with the other of markers 20, 30 on the projected images of reticle 20. Chuck 32 is also moveable vertically to provide an optimal focusing of the projected images on the dies 12, as will be discussed subsequently. The chuck 32 is provided on its upper surface with a plurality of concentric narrow lapped lands 302 shown in FIG. 8. Relatively wide grooves 303 separate lands 302 for wringing in the wafer 20 to lie substantially flat on lands 302 as described herinafter.

Illumination System

A reticle illumination system 34, shown in FIGS. 3-5, 10-15 and 19, comprises a light source 35 such as a mercury short arc lamp having rating of 200 W. The mercury lamp is pulsed at 500 W during wafer exposure and held at a standby power of 100 W during alignment and other operations. Thus, the average power consumption of the lamp during a typical wafer stepping operation is approximately 200 W.

An elliptical reflector 36 focuses the arc image of the lamp onto one end of a light pipe 40. A dichroic mirror 37 reflects only a selected wavelength band of light, thereby preventing the infrared and ultraviolet portions of the lamp spectrum from reaching the reticle. Hemispheric lenses 38, 39 are cemented to opposite ends of the light pipe 40 which aid the coupling of the light in and out of the pipe 40 as well as protect the end faces thereof. Light leaves the light pipe 40, passes through lens 39 and a shutter stator 43 having moveable shutter 44, and a lens and mirror arrangement 47 for illuminating a reticle 20.

The function of the light pipe 40 is to efficiently convert the nonuniform intensity distribution of light at the lamp end to a uniform distribution of light at the reticle end. Internal reflections within the light pipe are essentially lossless. The incoming light is folded and integrated with each internal reflection, thereby reducing nonuniformities. A main advantage of the light pipe 40 is that misalignment of the lamp or light source 35 merely reduces the total output intensity without noticably affecting the uniformity.

Optical Projection System

Alignment Shutter

After a predetermined exposure, monitored by a detector (not shown) located near the output of illumination system 34, the lamp power is dropped to 100 W and simultaneously shutter 44 is moved into the aperture plane. A small fraction of the light from source 35 passes through a cross opening 45 in shutter 44 and illuminates the marker 28, 30 on the reticle 20. A high pass dielectric filter (not shown) covers the opening 45 to prevent the g and h lines from exposing the wafer during alignment. On certain wafer levels, it may be necessary to use the mercury g line to enhance the alignment signal. In this case, it can be shown that the relative exposure value of the intensity reaching the wafer is 2% during normal exposure.

Broadband Illumination

At 500 w, the output intensity of the illumination system 34 between 400-450 nm has been measured at 0.5 W/cm$^2$. As seen in FIG. 17, this spectral distribution is characterized by a high continuum with strong lines at 405 nm and 436 nm. Given the sensitivity of positive resist shown in FIG. 17, approximately a 3-fold reduction in exposure time is realized using the entire 400-450 nm band as compared with using only the 436 nm line. Furthermore, broadband illumination reduces the effects of standing waves, resulting in improved linewidth control over oxide steps.

Unit Magnification Lens

Optical projection system 50, shown in FIGS. 3-5, 11-15 and 19, projects an image identical in size and form to reticle pattern 24 (i.e., without magnification or reduction) onto a predetermined focal plane. Projection system 50 comprises two components: a 10.16 cm front surface spherical mirror 52 and a cemented achromat-prism assembly 54. Assembly 54 comprises a cemented miniscus element 53 and plano-convex element 55 which correct any astigmatism of the concave mirror 52 at one-to-one for the g and h mercury lines. A pair of prisms 56, 57 are part of the optical design and also separate the reticle pattern plane R from the wafer image plane W, as seen in FIG. 5. To provide adequate clearance between vacuum chuck 32 and reticle 20, the optical axis 51 is tilted at 15 degrees from the horizontal, thereby placing reticle 20 at 30 degrees to the X-Y plane of movement of vacuum chuck 32. Thus, light passing through pattern 24 is reflected by the prism 56 through the lenses 55, 53 onto the mirror 52, back through the lenses 53, 55 and prism 57 and onto a wafer 10 positioned on vacuum chuck 32.

Mirror 52 includes a conical aperture 58 which is part of alignment system 60. Automatic alignment of each die with the projected reticle image is accomplished through the projection system 50 using a type of dark field imaging to produce an alignment signal. The design of the projection system 50 is simplified by providing for independent movement of the wafer to achieve proper focus, so that the optical members may remain stationary.

As shown in FIG. 5, mirror 52 and composite achromat-prism assembly 54 are diposed symetrically about optical axis 51. The object plane or reticle pattern plane R lies on one side of the axis 51 and the image or wafer plane W lies on the opposite side. Projection system 50 is best described with reference to the following Table I. It will be appreciated by those skilled in the art that the Table describes the optical system in accordance with the optical surfaces and materials through which light passes along one half of the optical path. Column 1 identifies the successive surfaces. Column 2 lists the thicknesses in millimeters of material behind the surface. Column 3 lists geometric data and Column 4 lists materials. The materials for surfaces B, C, D (prism 56 or 57, plano-convex element 55 and miniscus element 53, respectively) are identified by the names used by Schott Company, a well-known supplier of optical glass. Those trained in the art will recognize that the spherical surfaces are non-concentric; that is, their centers of curvature are not coincident. This feature allows a higher degree of image correction than would be possible with a concentric design.

TABLE I

| Surface 1 | Thickness in mm 2 | Radius of Curvature in mm 3 | Material 4 |
|---|---|---|---|
| A | 1.79 | ∞ (flat) | AIR |
| B | 26.80 | ∞ (flat) | LAKN7 |
| C | 10.02 | 35.00 | KF6 |
| D | 37.60 | 74.95 | SF2 |

TABLE I-continued

| Surface 1 | Thickness in mm 2 | Radius of Curvature in mm 3 | Material 4 |
|---|---|---|---|
| E | 189.37 | 264.00 | AIR |

Those skilled in the art will recognize that the Schott material LAKN7 is a lanthium dense crown glass; the Schott material KF6 is a light flint glass; the Schott SF2 is a dense flint glass.

The prisms 56, 57 perform a plurality of functions. The apex angle $\alpha$ of both prisms 56, 57 is 75°; the opposite equal interior angles $\beta$ are 52.5°. See FIG. 15. Prisms 56, 57 couple light into and out of projection system 50. In addition, the prisms are fashioned to provide a 1.78 mm air gap between surface 56a and reticle 20 and between surface 57a and wafer 10. Such an air gap is required for the needed mechanical clearances to move the wafer 10 and the reticle 20 into and out of the respective wafer plane W and reticle pattern plane R. The air gap is sufficiently large that dust particles as large as 200 microns will not adversely affect the system. Such particles will not be focused in a 1.78 mm air gap. It is the unique combination of prism material and angular configuration which efficiently couples the light through the system 50 and provides the large air gap.

Another advantage of the optical system 50 is that all the optical lens elements 53, 55, 56, 57 are all fashioned from preferred glasses. Such glasses are more easily and consistently manufactured than are other kinds of glasses.

Lens Fabrication

Three of the 10 optical surfaces are spherical, two of which require fabrication to better than $\lambda/10$. Surfaces A and B are polished flat to 80 /4. The prism diagonals 56d and 57d are specified to $\lambda/20$ to minimize lens-to-lens distortion. Autoalignment system 60 can be used to align the concave mirror 52 to the prism assembly 54 by adjusting for zero lateral 55, 53 color. With this alignment procedure, the decentering tolerance for plano-convex element 55 and meniscus element 53 is large by most design standards, approximately 125 μm. Cementing the prisms 56, 57 to the planar side of meniscus element 53 requires some care to avoid vignetting of rays close to the edges of the image field.

Optical Transmission

Optical coatings are applied to the air-glass surfaces A and D to maintain spurious reflections and ghost images to less than 1% of peak exposure. This is accomplished with a single $\lambda/4$ coating of $MgF_2$ on the glass-air surfaces. Due to the prism design, total internal reflection occurs at all ray angles, thus avoiding the requirement for metallic or dielectric coatings on the prism diagonals 56d, 57d, which would introduce polarization and phase disturbances with possible adverse effects on the image quality. The concave mirror 52 is coated with protected aluminum with approximately 90% reflectivity from 500–600 nm. Including absorption and surface reflections, the overall transmission through the projection lens is 80% in the 400–450 nm spectral band of resist sensivity.

Two Wavelength Correction

The design performance of an actual projection system 50 is summarized in Table II. A Strehl ratio of 1.0 signifies a perfect lens whose performance is limited only by fabrication errors and defocus. The Strehl ratio is maximized at two wavelengths over a specified field height. The design was optimized at the g and h mercury lines (436 nm and 405 nm respectively), achieving a minimum Strehl ratio of 0.99 over a 16.8 mm field radius. The residual astigmatism is held to within ±0.65 m of the focal plane which corresponds to a peak-to-peak wavefront error over the aperture of $\lambda/15$.

TABLE II

| Lens Performance | |
|---|---|
| Numerical aperture | .30 |
| Field Height | 16.8 mm |
| Corrected bandpass | 400–450 nm |
| Alignment bandpass | 400–600 nm |
| Strehl ratio | >.99 |
| Min usable linewidth | .80 m |
| Depth of focus (1 um lines) | 3.5 m |
| Telecentricity | <1.0 mrad |

Resolution and Depth of Focus

It is estimated that a 4.8 m depth of focus is required to maintain linewidth control to better than 0.125 m. This estimate assumes a partial coherence of $\sigma=0.4$ which results from using an f/4 illuminator with an f/1.6 projection lens. The estimated linewidth variation is based on a ±40% variation in actual resist exposure caused by changes in wafer reflectivity and topography. Subtracting out the residual astigmatism, the usable depth of focus becomes 3.5 μm. The minimum geometry attainable in production is estimated at 0.8 μm, based on a 1 μm depth of focus. Achieving this resolution, therefore, depends on the underlying topography and reflectivity associated with a given wafer level.

Telecentric Design

An important consideration in designing a one-to-one projection system is the requirement to locate telecentric stops at reticle pattern plane R and wafer image plane W. When this requirement has been met, rays entering parallel to the optical axis on the reticle side exit parallel on the wafer side. This feature ensures that no error in the size of the projected image results from small changes in the conjugate planes. As seen in Table II, the projection system 50 departs only 1 mrad from perfect telecentricity. As a result, the axial position of reticle 20 can vary as much as ±0.0051 cm; and yet the magnification error will be less than 0.05 m over the entire exposure area.

Thermal Gradients

Another factor to be considered with this type of lens is the degradation of the image quality due to absorption of near uv radiation within the lens elements. This problem has been particularly troublesome in lenses designed to work in the 365 nm region. With the proper choice of glasses used in prism assembly 54 and complete rejection of wavelengths below 400 nm by illumination system 34, the optical effects due to absorption can be made negligible.

A computer simulation of thermal gradients produced in the meniscus element 53 was performed using the manufacturer's values for absorption and thermal conductivity of the glass. The maximum time-averaged flux through the recticle was estimated at 200 mW/cm$^2$, stepping one exposure per second. Assuming the worst case of a clear reticle pattern with an area of 1.5 cm$^2$, the computer simulation yielded a maximum temperature gradient of 0.07° C./cm within the meniscus lens 53. Estimates of the inhomogeneity in the index of refraction, derived from the simulated temperature profiles, never exceeded 1.5×10$^{-6}$ which is comparable to the best available optical cut blanks.

Exposure Area

The exposure area shown in FIG. 18 has a circular perimeter with a 16.3 mm radius and a cord 5.5 mm from the center. To insure uniform resolution out to the corners of the exposure area, the perimeter radius is purposely chosen 0.5 mm smaller than the design field height H to provide a margin of safety for errors in fabrication and reticle placement. The constraint imposed by the cord insures clear passage through the prisms of all rays originating from the lower edge of the reticle field. As shown in FIG. 18, the largest square area permitted with the above constraints is 10×10 mm. Also shown is the largest available aspect ratio of 3:1, corresponding to a 7×21 mm exposure area. The user can choose from a continuous selection of aspect ratios between these two extremes with the total area per exposure ranging from 1 cm$^2$ to slightly under 1.5 cm$^2$.

Choosing the larger areas can substantially reduce the number of exposure steps required to cover a 10.16 cm wafer. For example, a 2×8 die array with a 0.262×0.351 cm pitch will fit into the 7×21 mm exposure area, requiring 51 steps to cover a 10.16 cm wafer. If the pitch were changed to 0.401×0.457 cm, one could fit a 2×4 array into an 8×18.3 mm exposure area, requiring only 48 steps to cover a 10.16 cm wafer. In both examples over 90 exposures per 10.16 cm wafer would be required with the 14–14.5 mm diameter fields available with current 10:1 projection lenses.

Reticle Alignment

Reticle 20 in one actual embodiment comprised a 7.62 cm×12.7 cm×0.28 cm L.E. 30 AR Cr plate 21, two reticle guides 26, and pellicle frame 22, with pellicle membrane attached. The reticle plate included four 1X pattern fields 24 with fiducial marks 28, 30 in the corners of each field. Two larger alignment keys were provided at each end of the reticle to permit reticle frame alignment and three fiducial marks were provided to permit reticle guide alignment, none of which are illustrated in FIG. 9. The guides and pellicle frame were attached with adhesives.

The various reticle alignment marks and keys may be generated on plate 21, usually with an electron beam pattern generator, at the same time as the pattern fields are generated, to provide the necessary alignment accuracy. In practice, three complete sets of pattern fields and alignment marks and keys have been written one inch apart across a 12.7 cm×12.7 cm plate. Such a plate can be rotated 90° and its patterns compared in an automatic inspection machine to permit selection of the best row. Large clear windows (not shown) may be provided at top and bottom and left and right to facilitate aligning pellicle frame 22 over the best row of patterns. The frame may be glued on with a die-cut double-sided adhesive ring. Such windows permit inspection of the bond.

After the pellicle is attached, the plate is cut to size in a suitable glass cutting fixture, care being taken to protect the delicate pellicle. The plate is then placed in a fixture that clamps guides 26 in position relative to the fiducial marks provided to aid reticle guide alignment. Guides 26 are glued in this position. Careful positioning of guides 26 ensures that the alignment mechanism of the stepping machine will be within its operating range. See FIGS. 8, 14 and 19. The alignment keys of reticle 20 preferably are placed a standard X-distance from a selected origin so the machine can scan the image of the keys through the cross masks of alignment system 60 by moving reticle 20 along the reticle stage and "know" where to place reticle 20 so that the fiducial marks 28, 30 will appear in cross masks 68, 69 when scanning a wafer. The alignment keys of reticle 20 preferably are placed at standard Y-distances from the same origin (4500 & 3500 microns, left & right, respectively) so the machine can scan the image of the keys through cross masks 68, 69 of the alignment system 60 by shifting the image with the tilting window 64 of the alignment system. See FIG. 19. The machine will then "know" how much to tilt the window so that fiducial marks 28, 30 will appear in the cross masks when scanning a wafer. The amount of tilt can be varied slightly for each reticle pattern to compensate for small errors in mounting reticle guides 26 to reticle plate 21.

Frosty Wafer

In order to produce an image at cross masks 68, 69 of alignment system 60 in a dark field imaging system, a special device called a "frosty wafer" is used to scatter the light from the projected image of the alignment keys of the reticle back into the dark center cone. The frosty wafer comprises a blank wafer with a 0.1 micron layer of thermally grown silicon dioxide for thermal coefficient compensation, followed by a 1 micron layer of evaporated aluminum to provide a mirror, topped by a 1 micron layer of unflowed silicon dioxide applied by chemical vapor deposition to provide light scattering. The effect is similar to a beaded movie screen, except that the grain size of the top layer is an order of magnitude smaller than the projected image of the alignment keys. This contributes to a smooth signal at a photomultiplier tube 66 provided in alignment system 60. Such a signal is necessary because wafer 10 is scanned under the projected image as reticle 20 is moved along the reticle stage 92.

Dark Field Automatic Alignment System

Alignment system 60 comprises the necessary optical and mechanical features to enable the stepping machine to adjust itself for different size recticle patterns and for reticle assembly errors. See FIGS. 5, 10, 11, 14 and 19. Starting at spherical mirror 52, light which was scattered into the dark central cone by the frosty wafer or a fiducial marker passes through aperture 58, which formed the dark cone. The light beam is partially focussed by a 147 mmf achromat lens 62 and bounced up toward tube 66 by a folding mirror 63.

The beam passes through a tilt window 64 which will refractively shift the image in the Y-direction if tilted by a computer controlled window motor 65. The beam then passes off center through a 200 mmf plano-convex lens 67 to finally focus at the plane of a pair of cross masks 68, 69. The off center passage corrects for color shift introduced when the return beam passed off center through achromat-prism assembly 54.

Before reaching cross masks 68, 69, the beam passes through one of three apertures 70, 71, 72 in a shutter 73 operated by a computer controlled shutter motor 74. Shutter 73 may be positioned so that right or left apertures 70, 71 alternately view reticle fiducial markers 28, 30 or the additional reticle alignment markers or keys previously described. Shutter 73 may also be positioned so that larger aperture 72 views both types of markers at once. The net effect of this is to split the difference in alignment error when aligning wafers. Large aperture 72 is fitted with a 50% neutral density filter to maintain constant signal strength at tube 66.

The light beam is focused at the cross masks 68, 69. The purpose of the cross masks is to blank out all light coming up the dark cone except that from the small area around an alignment marker or key. Masks 68, 69 are mounted in cross sliders 75 guided by a straightedge (not shown) and are moved equal distances apart by a wedge 76 driven by a motor 77. The computer can thus select the correct separation for a given set of alignment markers or keys.

After the cross masks the beam begins to spread, so a 38 mmf lens 78 is provided to gather the rays enough to hit the target cathode in photomultiplier tube 66. This tube converts light beam intensity to an electrical signal which is amplified and sent to the computer, in which the raw signal is modified by a zero suppression circuit and amplification gain adjustment to present the signal which the operator may monitor on CRT display 5. By means of a peak detection circuit an a voltage divider, the computer selects a sample point. As an optical image is scanned, the peak is detected and the signal drops to the sample point. The computer collects a position sample from the laser controlled stage. A scan in opposite directions cancels phase (time delay) errors so the computer can take the simple average as the position of an alignment feature. If inspection of the final results indicates a consistent error, the user may enter a compensating offset in the computer software.

Aperture 58 provides a dark cone or field in which light, scattered by one of die markers 14, 16 is readily detected by tube 66. As the projected image of one of reticle pattern markers 28, 30 is brought into registration with one of die markers 14, 16, light scattered from the pattern edges of the die marker passes through central aperture 58 in mirror 52, as shown schematically in FIG. 5. Such scattered light is transmitted through lens 62, past mirror 63 and through aperture 70 of shutter 73 for detection by photomultiplier tube 66, constructed in the conventional manner to convert received light to a corresponding production of electrons on an amplified basis. This technique provides a high signal to noise ratio, so that alignment accuracy is rather insensitive to defocus. The output of tube 66 is displayed on CRT 5. The signal waveform resembles a parabola as one of alignment marks 14, 16 is scanned along a given axis while being illuminated.

As shown in FIGS. 10, 11, 14 and 16, chuck 32 is disposed on a platform 79 supported on air bearings in a well known manner. Motors 80 (FIG. 10) 81 (FIG. 11) and 82 (FIG. 16) are respectively associated with the platform 79. Motors 80 and 81 are respectively coupled to the platform 79 to move it horizontally in X and Y coordinate directions in a conventional manner. Motor 82 is coupled to the platform 79 through a lead screw 83 to rotate the platform about a vertical axis extending through the center of the chuck 32.

A computer (not shown) processes the signals produced by the tube 66 to determine the relative coincidence of each marker 14 on die 12 with the projected image of marker 28 on reticle 20. The computer uses these signals to operate the motors 80 and 81 for respectively driving the platform 79 in the X and Y directions to position the image of markers 28 directly in registration with marker 14. Once the wafer 10 is aligned, its position can be subsequently accurately monitored by any suitable means, such as a laser interferometer system (not shown). Such a system will continuously update the computer with signals representative of the change in position of the platform 79.

When accurate registration has been obtained between markers 14 and the image of marker 28, the computer energizes motor 74 for rotating the shutter 73. Shutter 73 moves to a position where aperture 71 is provided for viewing marker 16 on die 12 to determine its registration with the projected image of reticle 20. The computer then causes the motor 82 to drive the platform 79 about the center of the chuck 32 until marker 16 registers with the projected image of marker 30.

The adjustments in the X and Y directions by the motors 80 and 81 and in the polar direction by the motor 82 may be continued until alignment is simultaneously provided between markers 14, 16 and the projected images of markers 28, 30. Upon the occurence of such simultaneous alignments, shutter 44 is opened and source 35 is fully energized to expose die 12 to the projected image of the patterns 24 on reticle 20. The die 12 is thereafter treated (by apparatus not constituting this invention) to produce electrical circuitry in accordance with such image.

The pattern 24 on reticle 20 may be reproduced on a plurality of different dies 12 on the wafer 10. Such reproduction is under the control of the computer. However, before such reproduction takes place, the chuck 32 is repositioned so that the markers 14 and 16 on the next die register with the projected images of the markers 28 and 30 on reticle 20. Such realignment is provided in the manner described above.

Reticle Operation

As previously described, reticle 20 comprises a transparent glass substrate or plate 21, on which a plurality of patterns 24 are provided. After one of patterns 24 has been reproduced on a particular number of dies 12 in accordance with the controls provided by the computer, reticle 20 may be advanced to the next pattern by a push rod 25 and bell crank mechanism 27 that temporarily couples the reticle to the X/Y platform 79. See FIGS. 9, 10, 12, 14 and 15. Reticle guides 26 are biased by spring loaded roller 91 to bear against a reticle bearing and alignment member 92 shown schematically in FIG. 9. Member 92 has a smooth straight bearing surface on which guides 26 may be moved. This arrangement positively locates reticle 20 in one direction. The reticle may be positively located and advanced in the orthogonal direction by a push rod 25 having two closely spaced pins 226, 227. The leading pin 226 bears against the edge of one guide 26. The other pin 227 sets into a recess provided in reticle guide 26. A bell crank mechanism 27 shown schematically in FIG. 10, or other suitable mechanism, selectively couples the push rod 25 to the platform 79 for moving the reticle 20 from one pattern to the next.

The controlled advance of reticle 20 through a distance corresponding to the spacing of patterns 24 is facilitated by the disposition of a pair of spaced rollers 94 that are spring loaded to bear against reticle 20. This reticle advancing feature facilitates the use of test reticle patterns during printing operation. During movement of reticle 20 from one pattern to the next, pressurized air is applied though ports 96 beneath reticle 20 to displace the reticle 20 into engagement with rollers 94. Upon movement of reticle 20 to the next pattern 24, the flow of pressurized air through the ports 96 is discontinued and a vacuum is applied to the ports. This causes the reticle 20 to become disposed against support surfaces 98 so that patterns 24 will be in a fixed and proper position in the optical path.

Focusing System-Construction

A focusing system 100 shown in FIGS. 6–8, 10, 11, 14 and 16 maintains the projected image of patterns 24 on reticle 20 in focus on die 12. System 100 includes a housing 101 for projection system 50 and a block 102 extending downwardly from the housing 101. The bottom surface 103 of block 102 extends above the top surface of the chuck 32. Three pneumatic probe lines 104 a, b, c extend downward through the block 102 to bottom surface 103, as seen in FIGS. 6, 7, 8 and 16. Probe lines 104 a, b, c communicate with a pressure line 106 extending from a source 108 of pressurized fluid, such as dry nitrogen or clean, dry, compressed air.

The focusing system 100 includes an upper spider assembly 201 and a lower spider assembly 202. The lower assembly has three radial arms 202 a, b, c, each for supporting a servo cylinder and piston assembly 110 a, b, c. The piston 111 of each assembly 110 is connected to the pedestal 33 of chuck 32 by an arm 124 a, b, c of upper spider 201. Each upper spider arm 124 is connected to the corresponding lower spider arm 202 a, b, c by one of three flexures 112 a, b, c to permit axial and prevent lateral movement. The three pistons 111 establish three points needed to define a plane parallel to the plane of wafer 10.

As shown in FIG. 7, pedestal 33 comprises a housing 304 within which a plunger 305 is forced up against detent balls 306 by a plurality of springs 307 acting on a spring plate 308. A shaft 209 supports chuck 33 on plunger 305. Microswitches (not shown) are actuated by a plate 308 to shut down the stepper X/Y stage if plunger 305 is knocked off detent balls 306 by accident. The lower spider 202 is supported for rotation in short arcs by pre-loaded vee bearings 113 fixed to the top of platform 79. A 200 step motor 82 drives an 80 pitch screw 83 having a travelling nut 116 attached to spider 202 at a radius of 15.88 cm. This linkage provides a theoretical resolution of 0.1 micron at each end of a maximum 21 mm image.

Chuck 32 has a total vertical movement range of 0.227 cm and platform 79 has a 15.88 cm by 30.48 cm travel, which allow the chuck to load and unload itself and to rise above wafer image plane W to contact pre-align microswitches (not shown). A two-stage vacuum source 310 permits skidding the wafer 10 onto chuck 32 at the loading station under light vacuum to "wring it in" flatter on the chuck, after which the pre-align microswitches can be bumped with the wafer at full vacuum without skidding. Concentric grooves 303 between narrow lapped lands 302 on the surface of chuck 32 provide a place for minute particles to settle when the wafer is wrung on at the loading station. The particles are scraped off the underside of the wafer 10 and fall into the grooves 303. Preferably, grooves 303 are substantially wider than lands 302.

Fluid under pressure is introduced into the lines 104 a, b, c through the line 106 from the source 108. The air flows through the lines 104 a, b, c to the bottom of the block 102 and is discharged through orifices 103 a, b, and c. Air flows through the space between bottom surface 103 and the top of the chuck 32. This flow of air provides an air bearing between the block 102 and the chuck 32 to maintain the block and the chuck in spaced relationship. This spacing is in the order of a few thousandths of a millimeter such as 0.076 mm.

Cylinder and piston assemblies 110 a, b and c are disposed at equally spaced positions around the periphery of the chuck. Since the various components associated with each assembly are identical, in the following discussion reference numerals will be used without alphabetic designations, except where required to distinguish one assembly from another. Each of pistons 111 is coupled to the chuck 32 by a rigid arm 124. The vertical disposition of the chuck 32 at a position adjacent to a piston 111 accordingly depends upon the vertical position of the associated arm 124.

The upper end of each assembly 110 is connected to a pressure line 105 which is in fluid communication with a probe line 104. The line 105 communicates with an upper chamber 117 defined at its upper end by a cover plate 118 and at its lower end by a resilient member or diaphragm 119 engaged with piston 111 and made from a suitable material such as rubber. Diaphragm 119 is retained in stretched relationship in chamber 117 by being clamped between the cover plate 118 and the cylinder 120 of assembly 110. Diaphragm 119 engages piston 111 which is vertically moveable in position. Each piston 111 is connected to a radially extending arm 124 which is vertically slidable in a slot 126 through the side of cylinder 120. The flexure 112 is in turn attached at one end to the arm 124 and at the other end to a lower spider arm 202.

A resilient member or diaphragm 130 made from a suitable material such as rubber engages the underside of piston 111 and is retained in a stretched relationship in the lower chamber 131 by being clamped between cylinder 120 and the upper surface of spider assembly 202. Chamber 131 is preferably provided with a fixed pressure such as approximately 7.039 kg/m$^2$, or one half the pressure of the source 108, via a pressure line 132.

Focusing System

FIG. 8 schematically illustrates how fluid from source 108 is controlled by a pressure regulator 133 to provide a precise output pressure, typically 14.078 kg/m$^2$. The regulator can be adjusted to other pressures by precision stepping motor 134. A three-way solenoid valve 135 is operable to turn off air to lines 104 to prevent blowing particles (dust) out of the chuck 32 when no wafer is present. Needle valves 136 control the flow of fluid to orifices (probes) 103. Needle valves 136 are adjusted to provide the same fluid pressure in the air gap as in the lower chamber 131. The lower chambers 131 are held to a predetermined fixed pressure, typically 7.039 kg/m$^2$ via line 137, a pressure regulator 138, and feed lines 132. Pressure lines 105 provide fluid communication between the upper chambers 117 and the pressure in air gap Z adjacent the associated orifice 103. A solenoid valve 139 in each pressure line 105 allows the computer to hold the upper chamber 117 at a given pressure before the wafer edge steps from underneath the probe. The air gap Z will develop a given back pressure as a function of the rate of flow. Thus, a change in the setting of the upper regulator 133 will simultaneously change the gap Z of all three orifices 103. The step motor 134 controls regulator 133 and is itself driven by the computer to permit initial focus adjustments.

Each pressure line 105 receives air at the same pressure as that in the line 104. When the pressure of the air in the lines 104 and 103 increases due, for example, to a decrease in air gap Z upon placement of a wafer 10 on chuck 32, an increased pressure is produced in the chamber 117. This pressure is exerted downwardly against diaphragm 119, so that piston 111 and arm 124 are accordingly moved downwardly against the force exerted by the pressure in lower chamber 131 acting on lower diaphragm 130, which acts as a return spring. The resultant movement downwardly of the arm 124 produces a corresponding movement downwardly of the chuck 32.

As the chuck 32 is moved downwardly, air gap Z is increased. This relieves the pressure of the air in the line 104 so that the pressure of the air in the line is regulated at a substantially constant value. As will be seen from the above discussion, the chuck 32 is wobbled individually by each of the piston and cylinder assemblies 110 in a direction transverse to the X-Y plane of movement of the chuck. In this way, the gap between the block 102 and a wafer on chuck 32 is regulated to maintain the die 12 on the wafer in focus with the projected image of pattern 24 of reticle 20.

Industrial Applicability

The invention is particularly useful in microlithography systems. However, those skilled in the art will appreciate that the optical projection system, in particular, has other applications such as in duplication of motion picture films and film strips. Of course, many other applications requiring one-to-one magnification will occur to those skilled in the optical arts.

We claim:

1. An apparatus for use in a microlithography system to align a semiconductor wafer having a plurality of dies, and fiducial marks, with the projected image of at least one pattern having further fiducial marks, said apparatus comprising:
   means for directing a beam of light toward a reticle;
   shutter means having an aperature for permitting a fraction of said beam to illuminate the fiducial marks of the reticle pattern;
   a projection lens comprising:
   a spherical concave mirror having an aperature on its optical axis,
   a meniscus lens having a first convex surface facing said mirror and a concave surface facing away from said mirror,
   a plano-convex lens having a second convex surface facing said concave surface and a first flat surface facing away from said mirror,
   and first and second prisms for coupling light into and from separate fields on said first flat surface, each of said prisms having a second flat surface facing one of the image and object planes of said projection lens, said image and object planes being spaced from said second flat surfaces, whereby said fraction of said beam passes through a reticle positioned at the object plane to illuminate a wafer positioned at the image plane;
   means for moving a wafer in said image plane to align the projected image of the fiducial marks of the reticle patterns with the further fiducial marks of a die on said wafer; and
   means for detecting light scattered through said aperature of said mirror to determine coincidence of the wafer and image fiducial marks.

2. Apparatus according to claim 1, wherein said shutter means comprises a filter for preventing passage of that portion of the spectrum of said beam normally used to expose a die for microlithograpic printing.

3. Apparatus according to claim 1, wherein said means for detecting comprises a plurality of aperatures selectively positionable to pass light scattered from fiducial marks on predetermined areas of said die.

4. Apparatus according to claim 1, wherein said means for detecting comprises mask means for blocking all scattered light except that from the area of a die around the projected image of a fiducial mark on the reticle, and a photomultiplier for detecting the intensity of light passing said mask means.

5. Apparatus according to claim 1, wherein said correcting means comprises means for shifting said scattered light relative to said mask.

6. Apparatus for use in a microlithography system to position a reticle pattern having spaced fiducial marks for subsequent projection of an image of said pattern and marks onto a semiconductor wafer having a plurality of dies with further, correspondingly positioned fiducial marks, said apparatus comprising:
   means for directing a beam of light toward a reticle;
   shutter means having an aperature for permitting a fraction of said beam to illuminate the spaced fiducial marks of the reticle pattern;
   a projection lens comprising:
   a spherical, concave mirror having an aperture on its optical axis,
   a meniscus lens having a first convex surface facing said mirror and a concave surface facing away from said mirror,
   a plano-convex lens having a second convex surface facing said concave surface and a first flat surface facing away from said mirror,
   and first and second prisms for coupling light into and from separate fields on said first flat surface, each of said prisms having an optical path length and a second flat surface facing one of the image and object planes of said projection lens, said object and image planes being spaced from said second flat surfaces, whereby said fraction of said beam passes through a reticle positioned at the object plane to illuminate a wafer positioned at the image plane;
   wafer means positioned at said image plane for scattering light from the projected image of the spaced fiducial marks of the reticle pattern;
   means including spaced aperatures selectively positionable to pass light scattered through said aperature of said mirror by said wafer from the projected image of the spaced fiducial marks of the reticle pattern;
   means for moving the reticle in the object plane to align the projected image of the spaced fiducial marks of the reticle pattern with said spaced aperatures; and
   means for detecting light passed through said spaced aperatures to determine coincidence of the wafer and reticle fiducial marks.

7. Apparatus according to claim 6, wherein said shutter means comprises a filter for preventing passage of that portion of the spectrum of said beam normally used to expose a die for microlithographic printing.

8. Apparatus according to claim 6, wherein said means for detecting comprises a plurality of further aperatures selectively positioned to pass light scattered from preselected projected images of the fiducial marks of the reticle pattern.

9. Apparatus according to claim 6, wherein said means for detecting comprises mask means for blocking all scattered light except that from the area of a die around the projected image of a fiducial mark on the reticle, and a photomultiplier for detecting the intensity of light passing said mask means.

10. Apparatus according to claim 6, wherein said correcting means comprises means for shifting said scattered light relative to said mask.

11. A unit magnification optical system for use in microlithography, comprising:
   a lamp having normal power rating at which it produces an output having a plurality of spectral lines with a low continuum between spectral lines;
   means for pulsing said lamp at a power substantially above said normal power rating to produce an output having a high continuum between at least two spectral lines; and
   a projection lens optimized at said at least two spectral lines comprising:
   a concave spherical mirror;
   a meniscus lens having a first convex surface facing said mirror and a concave surface facing away from said mirror;
   a plano-convex lens having a second convex surface facing said concave surface and a flat surface facing away from said mirror;
   and first and second prisms for coupling light from said lamp into and from said first flat surface, each of said prisms having an optical path length and a second flat surface facing one of the image and object planes of said projection lens, said optical path length being such that said image and object planes are spaced sufficiently from said second flat surfaces to preclude focusing of dust particles and to accomodate a pellicle.

12. A projection system according to claim 11, wherein said lamp is a mercury short arc lamp and said high continuum occurs between spectral lines at 405 mm and 436 mm.

13. A projection system according to claim 11, wherein said achromatic lens consists of said meniscus lens, said plano-convex lens and said prisms.

14. An optical system according to claim 13, wherein said meniscus lens is made from a light flint glass; said plano-convex lens, from a dense flint glass; and said prisms, from a dense crown glass.

15. A projection system according to claim 14, wherein said light flint glass is Schott SF2; said dense flint glass, Schott KF6; and said dense crown glass, Schott LAKN7.

* * * * *